United States Patent
Henkel et al.

(10) Patent No.: US 11,424,690 B2
(45) Date of Patent: Aug. 23, 2022

(54) SEMICONDUCTOR SWITCHING ARRANGEMENT

(71) Applicant: SIEMENS MOBILITY GMBH, Munich (DE)

(72) Inventors: Thomas Henkel, Roettenbach (DE); Andreas Nagel, Nuremberg (DE); Martin Lechler, Erlangen (DE)

(73) Assignee: Siemens Mobility GmbH, Munich (DE)

( * ) Notice: Subject to any disclaimer, the term of this patent is extended or adjusted under 35 U.S.C. 154(b) by 348 days.

(21) Appl. No.: 16/613,909

(22) PCT Filed: Apr. 16, 2018

(86) PCT No.: PCT/EP2018/059651
§ 371 (c)(1),
(2) Date: Nov. 15, 2019

(87) PCT Pub. No.: WO2018/210506
PCT Pub. Date: Nov. 22, 2018

(65) Prior Publication Data
US 2021/0119551 A1    Apr. 22, 2021

(30) Foreign Application Priority Data

May 15, 2017   (EP) ...................... 17171087

(51) Int. Cl.
*H01L 23/367* (2006.01)
*H02M 7/00* (2006.01)
*H02M 1/088* (2006.01)

(52) U.S. Cl.
CPC .......... *H02M 7/003* (2013.01); *H01L 23/367* (2013.01); *H02M 1/088* (2013.01)

(58) Field of Classification Search
CPC .... H02M 7/003; H02M 7/5387; H02M 1/088; H02M 1/008; H01L 23/367
(Continued)

(56) References Cited

U.S. PATENT DOCUMENTS

| 2004/0089934 A1 | 5/2004 | Shimoida et al. |
| 2010/0117570 A1 | 5/2010 | Nishimori et al. |

(Continued)

FOREIGN PATENT DOCUMENTS

| CN | 1225757 A | 8/1999 |
| CN | 101606311 A | 12/2009 |

(Continued)

*Primary Examiner* — Thienvu V Tran
*Assistant Examiner* — Shahzeb K Ahmad
(74) *Attorney, Agent, or Firm* — Laurence A. Greenberg; Werner H. Sterner; Ralph E. Locher

(57) ABSTRACT

A semiconductor switching arrangement contains at least two half-bridge modules that each have an AC voltage connection, a positive DC voltage busbar, a negative DC voltage busbar, and at least one AC voltage busbar. The AC voltage connections are electrically interconnected by the AC voltage busbar. The aim is to improve the current distribution to the half-bridge modules arranged electrically in parallel. To this end, at least in the region of the AC voltage connections, the positive DC voltage busbar and the negative DC voltage busbar extend over an area containing the AC voltage busbar. Two of the at least two half-bridge modules are arranged adjacently such that the AC voltage surfaces of the two of the at least two half-bridge modules are adjacently arranged in relation to each other. Ideally a converter can contain at least one such semiconductor switching arrangement.

10 Claims, 6 Drawing Sheets

(58) Field of Classification Search
CPC ..... H01L 23/492; H01L 23/36; H01L 25/115; H01L 25/072; H01L 25/16; H01L 25/18
See application file for complete search history.

(56) References Cited

U.S. PATENT DOCUMENTS

| | | | | |
|---|---|---|---|---|
| 2012/0205983 | A1* | 8/2012 | Koyanagi | H02M 7/483 307/77 |
| 2014/0354042 | A1* | 12/2014 | Wolff | H05K 7/1432 307/9.1 |
| 2015/0340962 | A1* | 11/2015 | Zhang | H02M 7/003 363/84 |
| 2017/0062386 | A1 | 3/2017 | Wang et al. | |

FOREIGN PATENT DOCUMENTS

| | | | |
|---|---|---|---|
| CN | 101826837 A | * | 9/2010 |
| CN | 101826837 A | | 9/2010 |
| CN | 202856635 U | | 4/2013 |
| CN | 103986350 A | | 8/2014 |
| CN | 105355611 A | | 2/2016 |
| CN | 105374810 A | | 3/2016 |
| CN | 106486458 A | | 3/2017 |
| CN | 106505876 A | | 3/2017 |
| EP | 2131482 A1 | | 9/2009 |
| WO | 9804029 A1 | | 1/1998 |

* cited by examiner

SEMICONDUCTOR SWITCHING ARRANGEMENT

BACKGROUND OF THE INVENTION

Field of the Invention

The invention relates to a semiconductor switching arrangement comprising at least two half-bridge modules that each have an AC voltage connection, a positive DC voltage busbar, a negative DC voltage busbar and at least one AC voltage busbar. Furthermore, the invention relates to a converter comprising such a semiconductor switching arrangement and a vehicle comprising at least one such semiconductor switching arrangement or one such converter.

To increase the performance of converters, or in general, switching devices based on semiconductors, a parallel connection of two or more semiconductors is made.

The direct, hard parallel connection of power semiconductors to increase the output power is a common technical solution. It is important that loading of the semiconductor is as uniform as possible. This is achieved by

- A selection of the semiconductor properties (for example, the same outlet characteristic) and
- A "symmetrical" arrangement of the semiconductors.

In this case, half-bridge modules are to be considered hereinafter. A half-bridge module has at least two semiconductor switches arranged in series. With this half-bridge module, a phase of a converter can be realized. The half-bridge module has a positive DC voltage connection for connecting to a positive DC voltage busbar, a negative DC voltage connection for connecting to a negative DC voltage busbar and an AC voltage connection for connecting to an AC voltage busbar. The positive DC voltage busbar has the positive potential of the intermediate circuit during operation and the negative DC voltage busbar has the negative potential of the intermediate circuit during operation. The AC voltage connection represents an AC voltage-side input or output, for example of a converter.

Half-bridge modules usually have a cuboid structure. The surfaces do not necessarily have a flat structure. They can be of any kind. The following description serves to designate the sides of the half-bridge module and thus to be able to describe the orientation of the half-bridge modules with respect to one another.

On a first surface, often also referred to as the upper side, are the corresponding connections of the half-bridge module. On the opposite side, the half-bridge module can be fastened, preferably to a heat sink for dissipating the heat produced during operation.

The four lateral surfaces of the half-bridge module are adjacent to the first surface. The two opposite longitudinal surfaces extend essentially parallel to a connection of one of the DC voltage connections to the AC voltage connection. The lateral surface which connects the two longitudinal surfaces to one another and is closer to the AC voltage connection is referred to as the AC voltage surface.

SUMMARY OF THE INVENTION

The object of the invention is to specify a semiconductor switching arrangement with half-bridge modules arranged in parallel on the AC voltage side, in which the current distribution to the individual half-bridge modules is improved.

The object is achieved by a semiconductor switching arrangement, having

- At least two half-bridge modules each with an AC voltage connection
- A positive DC voltage busbar, a negative DC voltage busbar and at least one AC voltage busbar, wherein the AC voltage connections are electrically interconnected by means of the AC voltage busbar, wherein at least in the region of the AC voltage connections, the positive DC voltage busbar and the negative DC voltage busbar extend over an area containing the AC voltage busbar, wherein two of the at least two half-bridge modules are arranged adjacently such that the AC voltage surfaces of the two of the at least two half-bridge modules are arranged adjacently in relation to each other. Furthermore, the object is achieved according to the invention by a converter comprising at least one such semiconductor switching arrangement and by a vehicle, particularly a rail vehicle, comprising at least one such semiconductor switching arrangement or one such converter.

Advantageous embodiments of the invention are specified in the dependent claims.

The invention is based on the finding that the current distribution between half-bridge modules arranged electrically in parallel can be improved in that not only the positive and negative DC voltage busbar extends over the area containing the AC voltage busbar, but also the half-bridge modules are arranged in such a way that they are located opposite one another at their AC voltage surface. As a result, the conductor loops, which determine the height of the inductance for each module of the individual half-bridge modules arranged in parallel are identical to one another. This brings about a uniform distribution of the currents to the individual parallel half-bridge modules, especially for transient processes. The higher the switching frequency of the modules, the stronger this effect. In other words, a particularly good uniform distribution of the currents to the individual modules can also be achieved for high switching frequencies.

An initial improvement in the current distribution can be achieved by increasing the DC intermediate circuit busbar, that is to say the positive DC voltage busbar DC+ and the negative DC voltage busbar DC− across the entire arrangement. As a result, the cross-section of the busbar is greater than it would have to be for the current amplifier. The reverse current of the AC load current can follow the contour of the AC voltage busbar (proximity effect) due to the increase in the area of the AC voltage busbar. This arrangement results in only minimal differences in inductance and thus a largely symmetrical current distribution.

It has proved to be particularly advantageous that, at least in the region of the AC voltage connections, the DC voltage busbars and the AC voltage busbar are arranged in parallel to one another. The busbars should be at a distance from each other which prevents a charge equalization between the rails (insulation distance).

By means of the arrangement of the half-bridge modules in pairs in which the AC voltage surfaces are located adjacent to each other, a particularly favorable arrangement of the busbars can be realized. In each case, the DC voltage connections, positive as well as negative, and the AC voltage connections are to be connected to one other by means of the positive DC voltage busbar, the negative DC voltage busbar and the AC voltage busbar. In this orientation of the half-bridge modules, the AC voltage connections point to one another and are covered by the AC voltage busbar and the intermediate circuit busbar.

This can now take place in a particularly simple manner. The AC voltage busbar is the busbar closest to the half-bridge modules. The AC voltage connections are also the connections which form the innermost connections in the arrangement of two half-bridge modules. The second closest busbar, that is to say, the one which follows from the half-bridge module behind the AC voltage busbar, is the one whose connections are located next to the AC voltage connections. The final busbar or even the busbar furthest from the modules constitutes the busbar which connects the outer connections of the half-bridge modules arranged in parallel to one another.

With this arrangement, none of the busbars has to penetrate another in order to be able to be connected to one of the connections. As a result, uniform inductive behavior for the individual half-bridge modules is achieved. The intermediate circuit busbar can thus be carried out in a particularly simple manner. Likewise, assembly is easy. Spacing in order to avoid flashovers or short circuits can be maintained in a simple manner by the spacing of the busbars. Thus, complicated and error-prone mounting steps, such as those which are required in the case of holes and bushings, are dispensed with in order to comply safely with predetermined spacing.

In an advantageous embodiment of the invention, the half-bridge modules are each arranged in pairs in such a way that the AC voltage surfaces of two half-bridge modules are each arranged adjacently in relation to one other.

A particular advantage in the construction of the semiconductor switching arrangement is that very different converter variants can thus be realized in a very simple manner. A plurality of phases is often required for realizing a converter, said phases being formed by different AC voltage busbars. Only the load connections need to be changed. This is done by shaping the AC voltage busbar. Other components of the power unit of the converter such as, for example, the intermediate circuit busbar and heat sink can be maintained unchanged in different configurations. This increases the number of identical parts in the production of different converter configurations and leads to low production costs.

Thus, for example, three phases each with four parallel half-bridge modules can be produced in a simple manner from 12 half-bridge modules. It is also possible to produce two phases with six parallel half-bridge modules. In this case, these arrangements differ only in the formation of the corresponding AC voltage busbars. Other possibilities are, for example, three 4-fold parallel phases or six 2-fold parallel phases. It is thus possible, depending on the number of half-bridge modules, to produce different configurations in a particularly simple manner solely by modifying the AC voltage busbars.

This embodiment is particularly advantageous if the semiconductor switching arrangement has an even number of half-bridge modules. All half-bridge modules present can then be arranged in pairs with respect to their AC voltage surface.

One possible embodiment is that the half-bridge modules are arranged in a circular manner. The AC voltage surfaces then lie adjacent to one another. Furthermore, the surface of the half-bridge module opposite the AC voltage surface is also adjacent to the surface of another half-bridge module opposite the AC voltage surface.

In a further advantageous embodiment of the invention, the different half-bridge modules which are arranged adjacent to one another in pairs with respect to their alternating-voltage surfaces are arranged adjacent to one another with respect to their longitudinal surface. This makes it possible for the converter to have a particularly compact design with a high degree of flexibility with regard to different configurations. As the structure and the arrangement differ only in terms of the AC voltage busbars, with this arrangement a highly flexible and at the same time compact design for a converter can be realized.

In a further advantageous embodiment of the invention, the positive DC voltage busbar and the negative DC voltage busbar are arranged without penetration with respect to one another for connection to the half-bridge modules. As the connections are arranged inversely with respect to one another, the busbar which is arranged closest to the half-bridge modules can be used to connect the innermost connections of the parallel connection to one another. The remaining busbars are stacked thereover. The higher the bar is arranged, the further outside the connection on the parallel connection of the half-bridge modules lies. The busbars can be produced without holes or bushings for connection to the half-bridge modules. As a result, the assembly is not only simple but also significantly less susceptible to faults as precise distances between the bushing and the hole are no longer necessary to ensure insulation distances.

In a further advantageous embodiment of the invention, the half-bridge modules are mounted on a plane, particularly on a heat sink. This makes it easy to provide a structural unit for a converter. The latter is also easy to replace on account of its weight. At the same time, it can be used universally for different converter configurations. This simplifies the spare parts inventory, which leads to significantly lower costs in logistics. It is particularly advantageous if a heat sink is selected as the plane. This then ensures the cooling of a plurality of half-bridge modules. At the same time, a heat sink is torsion-resistant in such a way that an arrangement of a plurality of half-bridge modules can be accommodated securely and firmly.

In a further advantageous embodiment of the invention, the adjacent half-bridge modules are arranged parallel to one another. The half-bridge modules can be arranged in a particularly space-saving manner using the parallel arrangement. As the mounting plane, for example designed as a heat sink, is also often rectangular, the heat sink can also be small and cost-effective in design.

BRIEF DESCRIPTION OF THE SEVERAL VIEWS OF THE DRAWING

The invention is described and explained in more detail hereinafter with reference to the exemplary embodiments illustrated in the figures. The figures show.

DESCRIPTION OF THE INVENTION

Figure 1:
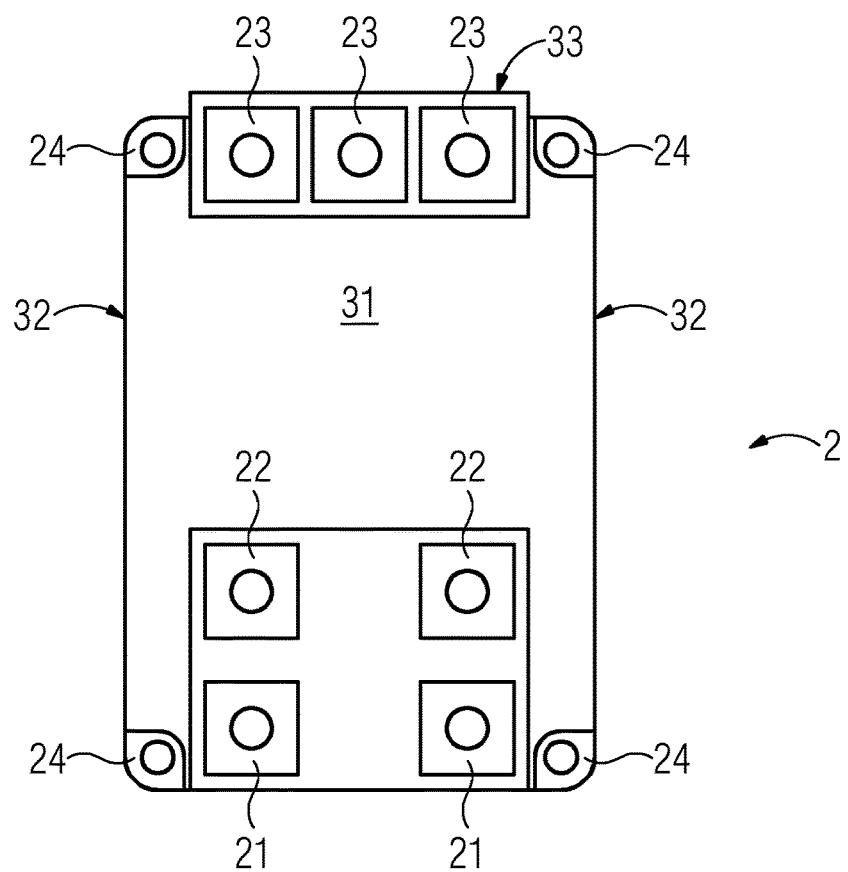
FIG. 1, FIG. 2 A half-bridge module.
Figure 2:
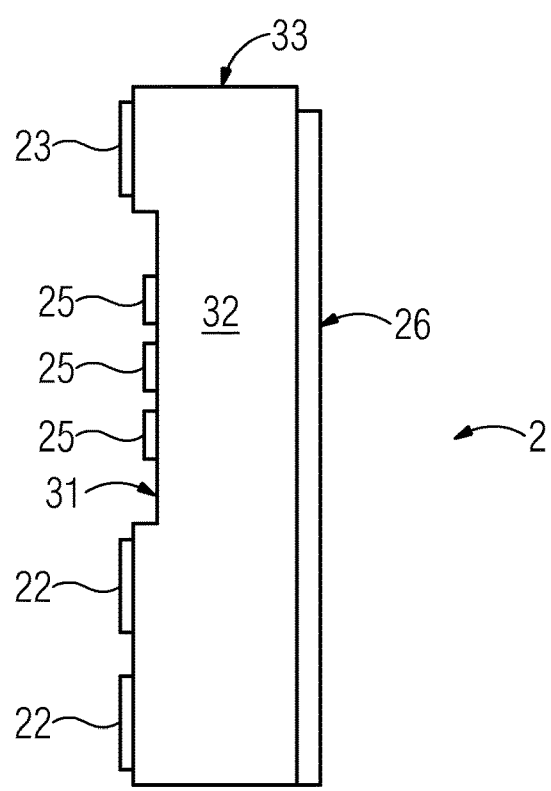

FIG. 1 shows a half-bridge module 2 with its DC voltage connections 21, 22 and its AC voltage connections 23. This illustrated side forms the first surface 31 of the cuboid half-bridge module 2. The bores 24 are used for fastening, for example to a heat sink 4 not shown here. The surfaces which adjoin the first surface 31 at right angles are the longitudinal surface 32 and the AC voltage surface 33. FIG. 2 shows a lateral view of the half-bridge module 2. To avoid repetitions, reference is made to the description of FIG. 1 and to the reference characters introduced therein. In addition, the underside 26 is shown here, on which the half-bridge module 2 is preferably connected to a heat sink 4. The control connections 25 are used to control the switches in the half-bridge module 2.

Figure 3:
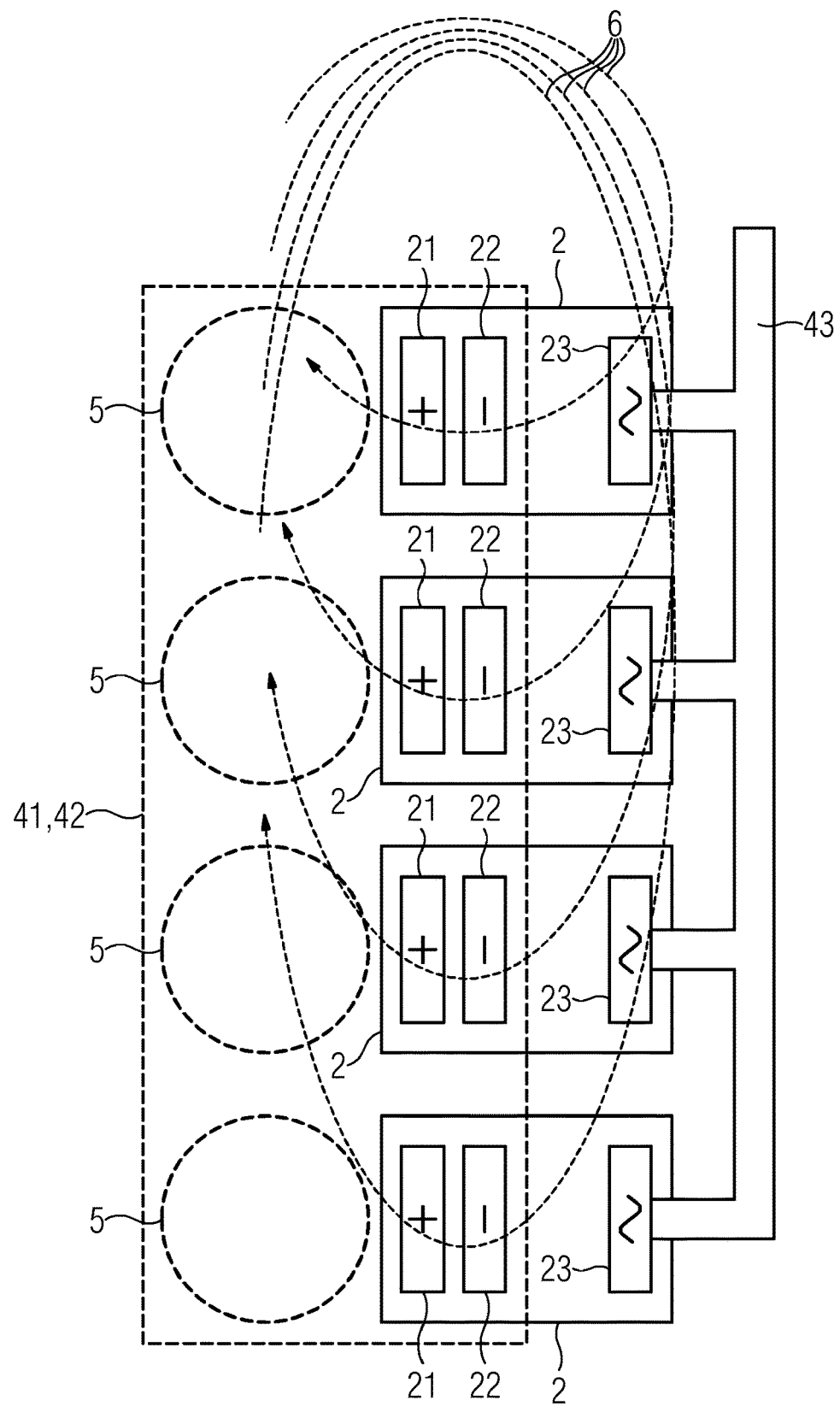
FIG. 3 Conductor loops with half-bridge modules arranged in parallel.

The different inductance ratios of the four half-bridge modules 2 can be illustrated with reference to FIG. 3. The half-bridge modules 2 are arranged next to one another on their longitudinal surface 32. To avoid repetition, reference is made to the description of FIGS. 1 and 2 and to the reference characters introduced therein. The individual connections are connected to busbars. The positive DC voltage busbar 41 and the negative DC voltage busbar 42, which are arranged one above the other, are available for connection to the capacitor 5. The electrical load (not shown) is connected to the AC voltage busbar 43. The commutation circuit is connected via the load. In each case it can be seen that this results in different conductor loops 6 for the half-bridge module 2, leading to different inductances. These sometimes cause rather high current asymmetries in current distribution to the various half-bridge modules 2.

Figure 4:
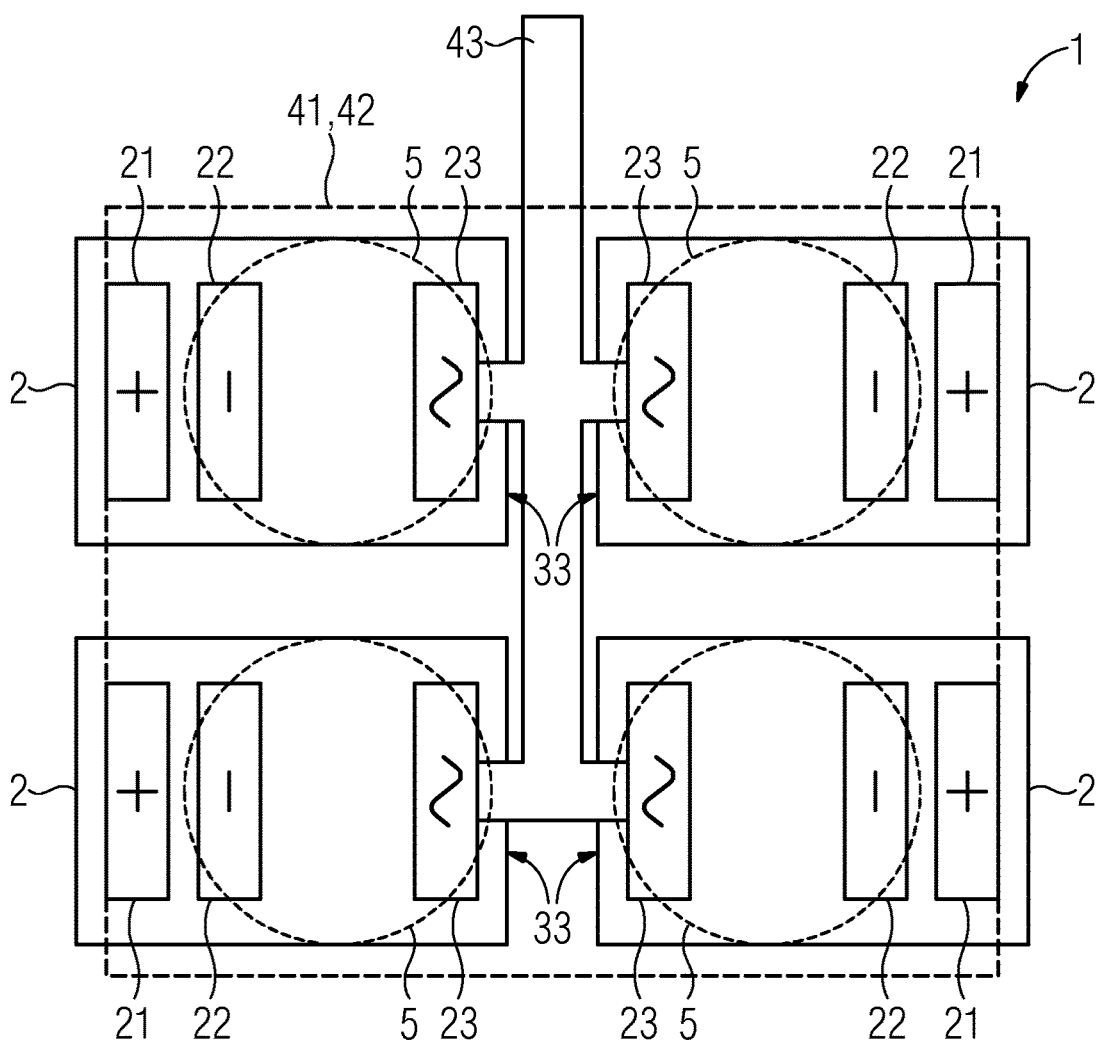
FIG. 4 to FIG. 9 Exemplary embodiments of semiconductor switching arrangements and FIG. 10 A rail vehicle.
Figure 5:
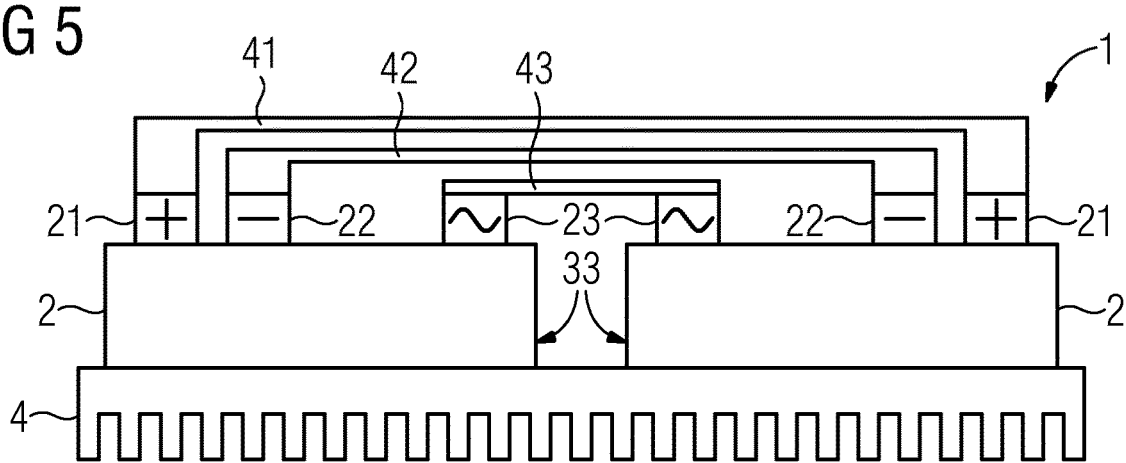

FIG. 4 shows an exemplary embodiment of a semiconductor switching arrangement 1. The half-bridge modules 2 are arranged in pairs in such a way that the AC voltage surfaces 33 are adjacent. Furthermore, the positive DC voltage busbar 41 and the negative DC voltage busbar 42 also extend over the area of the AC voltage connections 23, particularly also over the AC voltage busbar 43 in the area of the AC voltage connections 23. As a result of this structure, the inductances of the individual commutation circuits are equal or at least almost the same size, so that a uniform current distribution results on the half-bridge modules arranged electrically in parallel. FIG. 5 shows a lateral view of the exemplary embodiment according to FIG. 4. To avoid repetition, reference is made to the description of FIG. 4 and to the reference characters introduced therein. The heat sink 4 is used for cooling and for mechanical attachment of the semiconductor switching arrangement 1. As a result of the orientation in which the AC voltage surfaces 33 are located adjacent to one another, a favorable arrangement of the connections 21, 22, 23 is produced. These connections can be connected by means of busbars 41, 42, 43 without one of the other busbars 41, 42, 43 having to be penetrated for this purpose. The individual connections can thus not only be connected in a simple and error-free manner, but the busbars 41, 42, 43 can also be produced simply and inexpensively as a result of the absence of bushings.

The following FIGS. 6 to 9 show exemplary embodiments of how the semiconductor switching arrangement 1 for example, can be designed for the construction of a converter 3. It should be noted that for all these exemplary embodiments the 12 half-bridge modules 2 are arranged identically and only differ as regards the AC voltage busbar 43. This shows that this semiconductor switching arrangement 1 can be used in a modular manner and different configurations can be realized in a simple manner. In addition to the number of 12 half-bridge modules shown here, any other arbitrary number of half-bridge modules can also be arranged. A number of half-bridge modules 2 which can be divided by 2 is particularly advantageous as two half-bridge modules can then be arranged respectively in pairs adjacent to their AC voltage surfaces.

Figure 6:
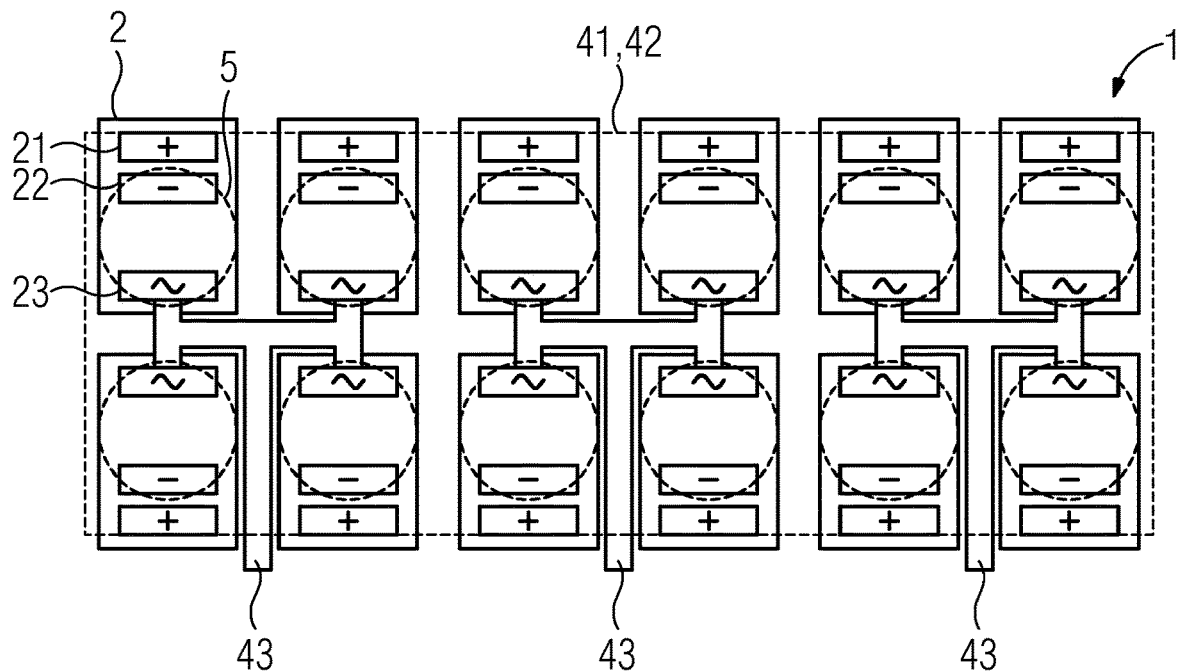
Figure 7:
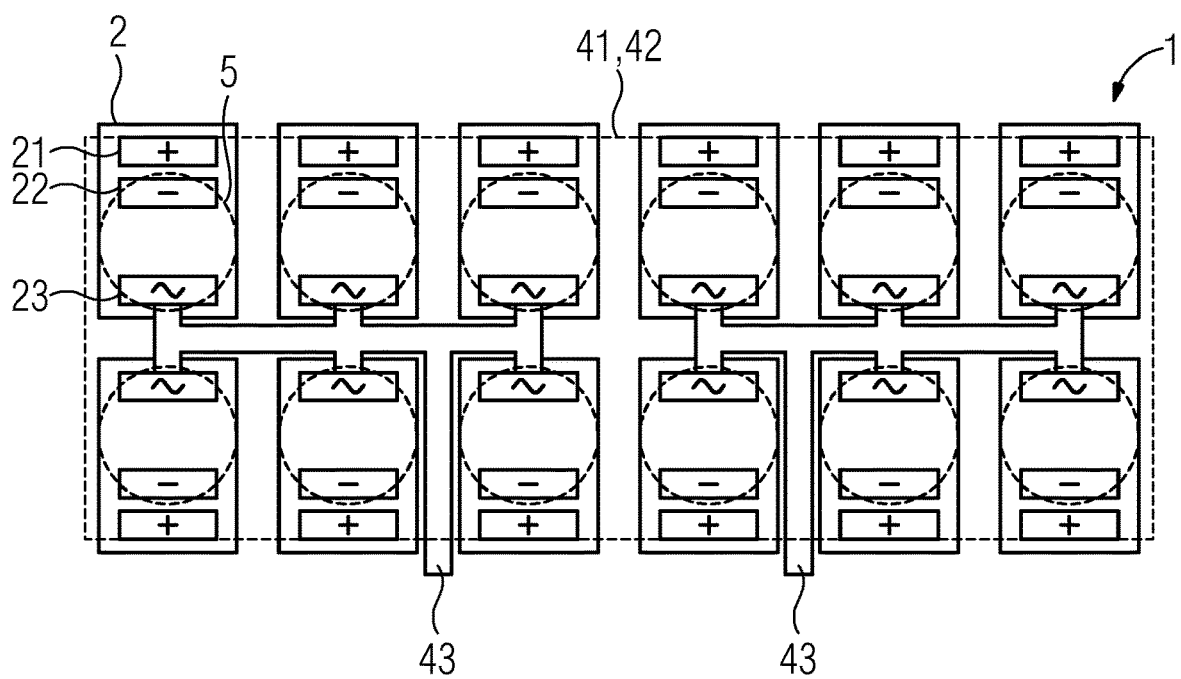
Figure 8:
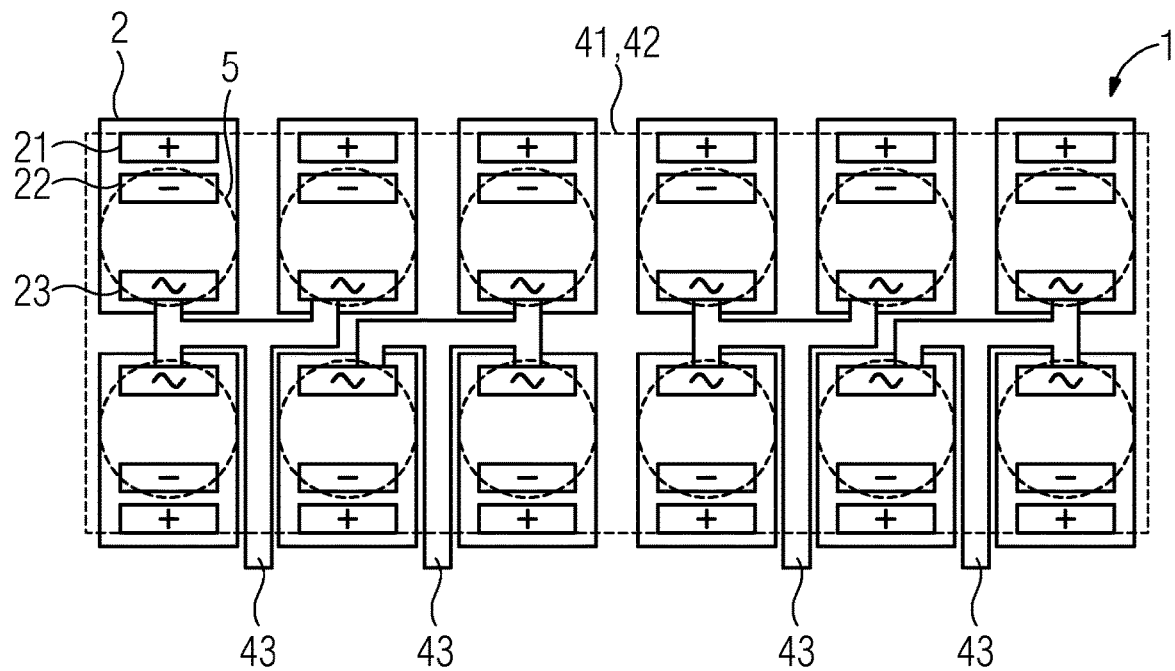
Figure 9:
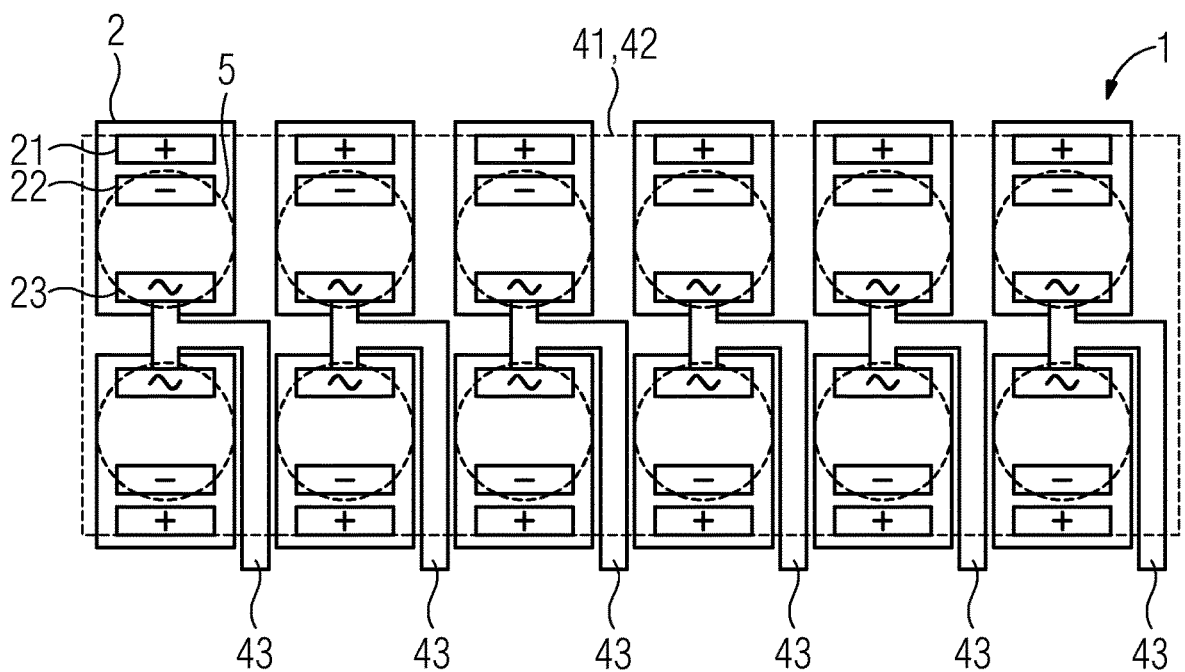

FIG. 6 shows an exemplary embodiment with three phases and a 4-fold parallel connection. FIG. 7 shows an exemplary embodiment with two phases and a 6-fold parallel connection. FIG. 8 shows an exemplary embodiment with four phases and a 3-fold parallel connection. FIG. 9 shows an exemplary embodiment with six phases and a 2-fold parallel connection.

Figure 10:
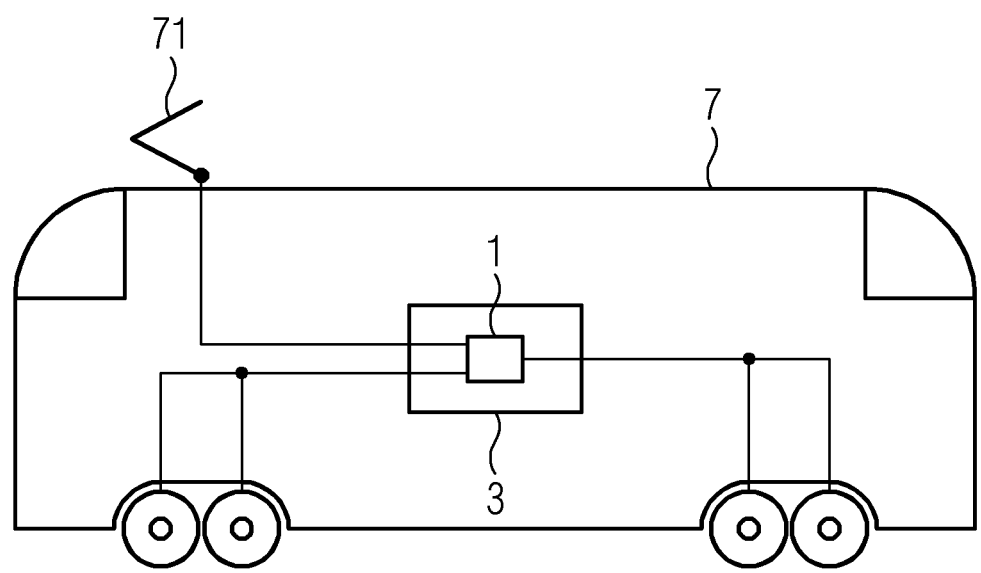

FIG. 10 shows a vehicle 7 which is a rail vehicle. A converter 3 comprising a semiconductor switching arrangement 1 is arranged in the vehicle 7. The converter 3 is used to supply the motors of the vehicle 7 with electrical energy in a controlled manner. The vehicle 7 draws the energy required for this purpose from a contact wire not shown here by means of a current collector 71.

In summary, the invention relates to a semiconductor switching arrangement comprising at least two half-bridge modules that each have an AC voltage connection, and a positive DC voltage busbar, a negative DC voltage busbar and at least one AC voltage busbar, wherein the AC voltage connections are electrically interconnected by means of the AC voltage busbar. To improve the current distribution to these half-bridge modules arranged electrically in parallel, it is proposed that at least in the region of the AC voltage connections, the positive DC voltage busbar and the negative DC voltage busbar extend over an area containing the AC voltage busbar, wherein two of the at least two half-bridge modules are arranged adjacently such that the AC voltage surfaces of the two of the at least two half-bridge modules are arranged adjacently in relation to each other. Furthermore, the invention relates to a converter comprising at least one such semiconductor switching arrangement. In addition, the invention relates to a vehicle, particularly a rail vehicle, comprising at least one such semiconductor switching arrangement or one such converter.

The invention claimed is:

1. A semiconductor switching configuration, comprising:
   at least two half-bridge modules each having an AC voltage connection, an AC voltage surface, a negative DC voltage connection, and a positive DC voltage connection;
   a positive DC voltage busbar;
   a negative DC voltage busbar;
   at least one AC voltage busbar, said AC voltage connections are electrically interconnected by means of said AC voltage busbar;
   at least in a region of said AC voltage connections, said positive DC voltage busbar and said negative DC voltage busbar extending over an area containing said AC voltage busbar; and
   two of said at least two half-bridge modules being disposed adjacent one another such that said AC voltage surface of said two half-bridge modules are disposed spatially adjacently in relation to one another and said AC voltage connections form innermost connections;
   wherein said AC voltage busbar forms an innermost busbar connection that is closest to said at least two half-bridge modules;
   wherein said positive and negative DC voltage busbars, depending on a placement of said positive and negative connections of said at least two half-bridge modules relative to said AC voltage connections form an outermost busbar connection and an intermediate busbar connection disposed between said innermost and outermost busbar connections; and
   wherein said positive DC voltage busbar and said negative DC voltage busbar connecting said half-bridge modules are disposed in a penetration-free manner in relation to one another.

2. The semiconductor switching configuration according to claim 1, wherein said half-bridge modules are each disposed in pairs in such a way that said AC voltage surface of said two half-bridge modules are each disposed spatially adjacently in relation to one another.

3. The semiconductor switching configuration according to claim 2, wherein different ones of said half-bridge modules adjacently disposed in pairs with regard to said AC voltage surface are disposed spatially adjacently in relation to one other with regard to a longitudinal surface.

4. The semiconductor switching configuration according to claim 1, wherein said half-bridge modules are mounted on a plane.

5. The semiconductor switching configuration according to claim 4, further comprising a heat sink, said half-bridge modules are mounted on said heat sink.

6. The semiconductor switching configuration according to claim 1, wherein said half-bridge modules disposed adjacent to one another are disposed parallel to one another.

7. A converter, comprising:
a semiconductor switching configuration, containing:
at least two half-bridge modules each having an AC voltage connection, an AC voltage surface, a negative DC voltage connection, and a positive DC voltage connection;
a positive DC voltage busbar;
a negative DC voltage busbar;
at least one AC voltage busbar, said AC voltage connections are electrically interconnected by means of said AC voltage busbar;
at least in a region of said AC voltage connections, said positive DC voltage busbar and said negative DC voltage busbar extending over an area containing said AC voltage busbar; and
two of said at least two half-bridge modules being disposed adjacent one another such that said AC voltage surface of said two half-bridge modules are disposed spatially adjacently in relation to one another and said AC voltage connections form innermost connections;
wherein said AC voltage busbar forms an innermost busbar connection that is closest to said at least two half-bridge modules;
wherein said positive and negative DC voltage busbars, depending on a placement of said positive and negative connections of said at least two half-bridge modules relative to said AC voltage connections, form an outermost busbar connection and an intermediate busbar connection disposed between said innermost and outermost busbar connections; and
wherein said positive DC voltage busbar and said negative DC voltage busbar connecting said half-bridge modules are disposed in a penetration-free manner in relation to one another.

8. A vehicle, comprising:
a semiconductor switching configuration, containing:
at least two half-bridge modules each having an AC voltage connection, an AC voltage surface, a negative DC voltage connection, and a positive DC voltage connection;
a positive DC voltage busbar;
a negative DC voltage busbar;
at least one AC voltage busbar, said AC voltage connections are electrically interconnected by means of said AC voltage busbar;
at least in a region of said AC voltage connections, said positive DC voltage busbar and said negative DC voltage busbar extending over an area containing said AC voltage busbar; and
two of said at least two half-bridge modules being disposed adjacent one another such that said AC voltage surface of said two half-bridge modules are disposed spatially adjacently in relation to one another and said AC voltage connections form innermost connections;
wherein said AC voltage busbar forms an innermost busbar connection that is closest to said at least two half-bridge modules;
wherein said positive and negative DC voltage busbars, depending on a placement of said positive and negative connections of said at least two half-bridge modules relative to said AC voltage connections, form an outermost busbar connection and an intermediate busbar connection disposed between said innermost and outermost busbar connections; and
wherein said positive DC voltage busbar and said negative DC voltage busbar connecting said half-bridge modules are disposed in a penetration-free manner in relation to one another.

9. The vehicle according to claim 8, wherein the vehicle is a rail vehicle.

10. The vehicle according to claim 8, further comprising a converter and said semiconductor switching configuration is part of said converter.

* * * * *